United States Patent [19]

Sagara et al.

[11] Patent Number: 4,984,048

[45] Date of Patent: Jan. 8, 1991

[54] SEMICONDUCTOR DEVICE WITH BURIED SIDE CONTACT

[75] Inventors: Kazuhiko Sagara, Hachioji; Tokuo Kure, Kokubunji; Eiichi Murakami, Fuchu; Tohru Nakamura, Tanashi; Masanobu Miyao, Tokorozawa; Masao Kondo, Hachioji; Akitoshi Ishizaka; Yoichi Tamaki, both of Kokubunji, all of Japan

[73] Assignee: Hitachi, Ltd., Tokyo, Japan

[21] Appl. No.: 216,536

[22] Filed: Jul. 8, 1988

[30] Foreign Application Priority Data

Jul. 10, 1987 [JP] Japan ................... 62-171146
Nov. 2, 1987 [JP] Japan ................... 62-275818
Dec. 7, 1987 [JP] Japan ................... 62-307510

[51] Int. Cl.$^5$ .................. H01L 29/72; H01L 29/06
[52] U.S. Cl. .......................... 357/34; 357/59; 357/49; 357/55; H01L/29/72; H01L/29/06
[58] Field of Search ............ 357/34, 55, 49, 59

[56] References Cited

U.S. PATENT DOCUMENTS

| | | | |
|---|---|---|---|
| 4,333,227 | 6/1982 | Horng et al. | 357/34 |
| 4,589,193 | 5/1986 | Goth et al. | 357/49 |
| 4,686,557 | 8/1987 | Mahrla | 357/20 |
| 4,688,069 | 8/1987 | Joy et al. | 357/34 |
| 4,696,097 | 9/1987 | McLaughlin et al. | 357/34 |
| 4,717,681 | 1/1988 | Curran | 357/16 |
| 4,733,287 | 3/1988 | Bower | 357/34 |
| 4,739,379 | 4/1988 | Akagi et al. | 357/34 |
| 4,749,661 | 6/1988 | Bower | 357/34 |

Primary Examiner—Andrew J. James
Assistant Examiner—Jerome Jackson, Jr.
Attorney, Agent, or Firm—Fay, Sharpe, Beall, Fagan, Minnich & McKee

[57] ABSTRACT

Polycrystalline silicon which is provided within a trench for isolating a plurality of bipolar transistors from each other is electrically connected to the collector of one of the bipolar transistor. Since the trench for isolation can also be used to lead out the collector electrode, the required area is minimized. Thus, the arrangement is effective in creasing the integration density.

30 Claims, 8 Drawing Sheets

SEMICONDUCTOR DEVICE WITH BURIED SIDE CONTACT

BACKGROUND OF THE INVENTION

The present invention relates to a semiconductor device and, more particularly, to a bipolar semiconductor device which enables an increase in integration density.

A typical conventional bipolar semiconductor device has heretofore been arranged such that a heavily-doped buried layer providing a lead for a collector is formed in a surface region of a silicon substrate and an island which is made of single crystal silicon is formed above the buried layer, as described in the specification of Japanese Pat. Laid-Open No. 56-1556 (1981). In this prior art, an active region which is necessary for transistor operation is formed in one single crystal silicon island. Another island (sub-collector region) made of single crystal silicon is provided above the buried layer, in addition to the single crystal silicon island, having the active region formed therein in such a manner that the sub-collector region is connected to the buried layer. A collector electrode is led out from the surface of the silicon substrate through the sub-collector region.

Furthermore, isolation between the emitter and base regions of the conventional transistor is effected using an insulating film formed on the surface of the base lead-out electrode. The emitter and base electrodes are disposed so that they do not planarly overlap each other.

The above-described prior art suffers, however, from the problem that, as transistor sizes shrink, the area ratio of the active region, necessary for a transistor operation to the sub-collector region becomes substantially 1:1. Therefore, it is therefore difficult to further reduce the area required to provide transistors.

In addition, since the emitter and base electrodes must be disposed so as not to planarly overlap each other and spaced apart from each other by a predetermined distance, the prior art has difficulty in increasing integration density.

SUMMARY OF THE INVENTION

In view of the above-described problems of the prior art, it is a primary object of the present invention to provide an ultraspeed bipolar semiconductor device which enables an increase in integration density and which can be manufactured in a relatively simple process.

The above-described object is attained by leading out the collector (emitter in the case where the transistor is operated backward; the same is true of the following description) electrode by making use of a conductive layer provided in an isolation trench.

DETAILED DESCRIPTION OF THE PREFERRED EMBODIMENTS

At present, selective oxidation is widely employed for isolation in semiconductor devices. As a substitute for this, U-shaped isolation has been proposed wherein a deep trench having a U- or Y-shaped cross-section is vertically provided in a silicon substrate and an insulating film is formed on the inner surface of the trench and further this trench is filled with polycrystalline silicon or the like to use it as an isolation trench [see the specification of Japanese Pat. Laid-Open No. 56-88150 (1981)]. Since the U-shaped isolation needs a smaller area than the selective oxidation, it is more effective in reducing device sizes than the latter. The U-shaped isolation trench is formed deeper than a buried layer, and therefore it is possible to electrically connect the buried layer and the inside of the trench by providing an opening in the insulating film formed on the inner surface of the isolation trench. Accordingly, if a conductive material, for example, polycrystalline silicon, is provided in the isolation trench through the insulating film, it is possible to lead out a collector (emitter) electrode from a surface of the semiconductor substrate through this conductive material.

More specifically, according to the present invention, a conductive material provided in the isolation trench is also used as a collector leadout interconnection layer. Accordingly, the inside of the isolation trench is used as a collector (emitter) electrode lead-out region, so that there is no need for a conventional sub-collector (sub-emitter) region and therefore the area required to provide transistors is reduced considerably.

Further, since the emitter and base electrodes may be disposed so as to planarly overlap each other, it is unnecessary to provide a margin for mask alignment in patterning the two electrodes. From this viewpoint also, it is possible to reduce the area required to provide transistors.

Figure 1:
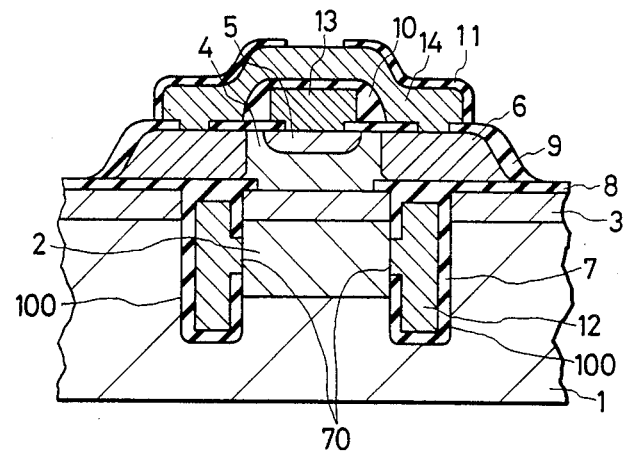
FIG. 1 shows the cross-sectional structure of one embodiment of the semiconductor device according to the present invention.

Embodiment 1:

FIG. 1 is a sectional view of a semiconductor device according to a first embodiment of the present invention.

In this figure, the reference numeral 1 denotes a p-type silicon substrate, 2 an n-type buried layer for collector, 3 an n-type silicon epitaxial layer, 4, a p-type doped region (base region), 6 a low-resistance p-type doped region (base lead-out electrode), 5 an n-type doped region (emitter region), 13 an emitter electrode (first electrode), 14 a base electrode (second electrode), 8, 9, 10, 11 insulating films, 100 an isolation trench, 7 an insulating film formed on the inner surface of the isolation trench 100, 70 an opening formed in the insulating film 7, and 12 a low-resistance polycrystalline silicon layer (conductive layer) buried inside the isolation trench 100 through the insulating film 7.

FIGS. 2 to 7 are sectional views showing steps in the process for producing the semiconductor device shown in FIG. 1.

Figure 2:
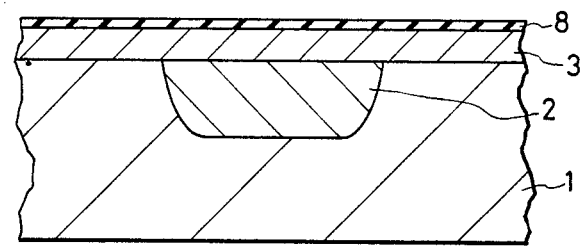
FIGS. 2 to 7 show steps in the process for producing the semiconductor device shown in FIG. 1.

First, as shown in FIG. 2, an n-type impurity is diffused into a part of a p-type silicon substrate 1 to form an n-type buried layer 2. Thereafter, an n-type silicon epitaxial layer 3 is grown using an epitaxial growth technique. At this time, it is preferable to effect epitaxial growth under conditions of a reduced pressure and a low temperature with a view to suppressing diffusion of an impurity into the epitaxial layer 3 from the n-type buried layer 2. Subsequently, an insulating film 8, for example, silicon dioxide, is formed on the surface of the n-type epitaxial layer 3.

Figure 3:
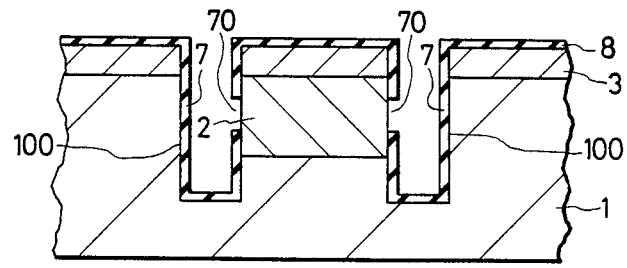

Thereafter, as shown in FIG. 3, an isolation trench 100 is provided around the n-type buried layer 2 such that the trench 100 is deeper than the buried layer 2 by using conventional photolithography and dry etching techniques. Next, an insulating film 7 is formed on the inner surface of the isolation trench 100. In this embodiment, silicon dioxide is employed as the insulating film 7. Thereafter, that part of the insulating film 7 which is in contact with the n-type buried layer 2 is partially removed to provide an opening 70.

Figure 4:
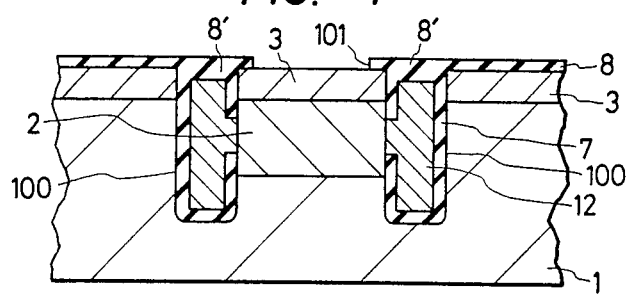

Subsequently, as shown in FIG. 4, a conductive material is uniformly provided in the isolation trench 100 through the insulating film 7 to form a conductive layer 12, and the surface of the isolation trench 100 is covered with an insulating film 8'. Although in this embodiment low-resistance n-type polycrystalline silicon is employed as the conductive material, other low-resistance metallic materials, e.g., silicides, may also be employed. Thereafter, a part of the insulating film 8'is removed to provide an opening 101 to expose the n-type epitaxial silicon layer 3.

Figure 5:
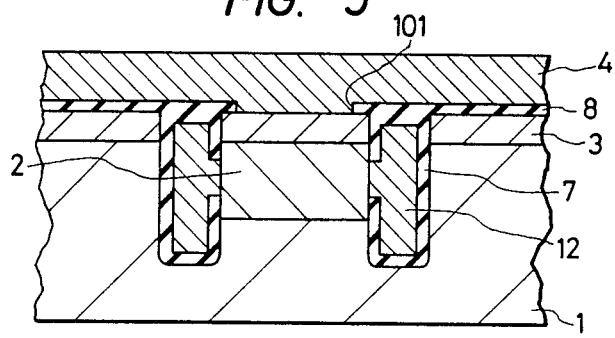

Subsequently, a p-type doped region 4 comprising single crystal silicon extending over the opening 101 through which the epitaxial silicon layer 3 is exposed and polycrystalline silicon extending over the other region is formed using solid phase epitaxy or other similar means, as shown in FIG. 5.

Figure 6:
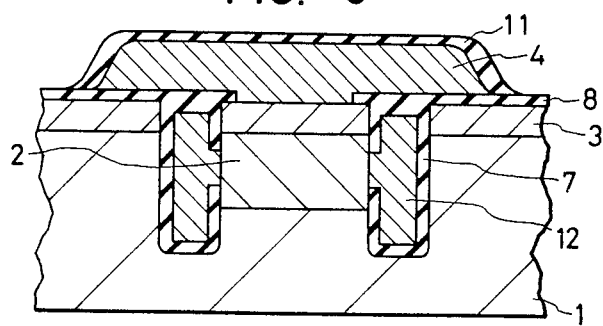

Next, unnecessary portions of the p-type doped region 4 in the regions other than the base region and the base lead-out electrode forming region are removed using conventional photolithography and dry etching techniques, as shown in FIG. 6. Next, an insulating film 11, for example, silicon dioxide, is provided on the surface of the p-type doped region (base region) 4.

Figure 7:
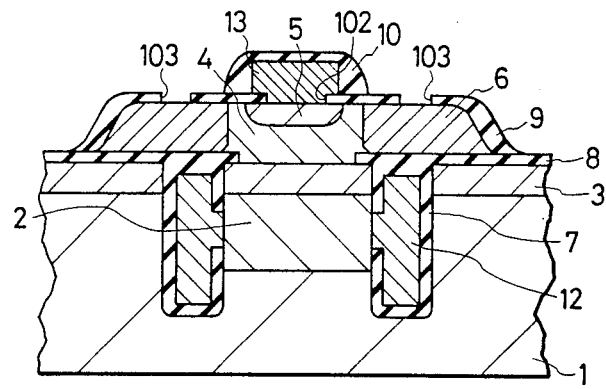

Thereafter, as shown in FIG. 7, a part of the insulating film 11 is removed to form an opening 102, and an n-type polycrystalline silicon layer 13 is then formed by the known CVD. Subsequently, a heat treatment is carried out in a non-oxidizing atmosphere to diffuse an n-type impurity contained in the n-type polycrystalline silicon layer 13 into the p-type doped region 4 to thereby form an n-type region (emitter region) 5. The n-type polycrystalline silicon layer 13 is etched such that a necessary portion alone is left. Thereafter, an insulating film 10 is deposited as a spacer on the side wall of the n-type polycrystalline silicon layer (emitter electrode) 13. The width of this spacer can be controlled as desired by adjusting the thickness of the insulating film 10. Next, with the spacer used as a mask, a p-type impurity is introduced into the p-type doped region 4 except for the base region to form a low-resistance p-type doped region (base lead-out electrode) 6. In other words, it is possible to control the distance between the n-type doped region 5 and the p-type deped region 6 by controlling the thickness of the insulating film 10 serving as a spacer. It should be noted that a silicide, which is a low-resistance interconnection material, may be employed for at least a part of the p-type doped region 6.

Thereafter, an opening 103 is provided in a part of the insulating film 9, and a low-resistance interconnection material, for example, aluminum, polycrystalline silicon or a silicide, is deposited on the whole surface of the element, as shown in FIG. 1. After this interconnection layer (base ELECTRODE) 14 is patterned, an insulating film 11 is deposited on the surface, and an electrode leadout opening is provided in a part of the insulating film 11, thus completing a semiconductor device having the structure shown in FIG. 1.

Figure 8:
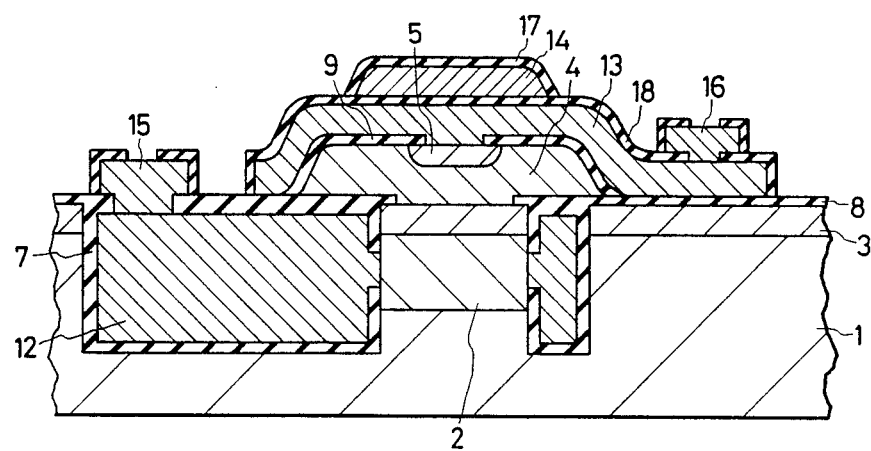
FIG. 8 shows the cross-sectional structure of the semiconductor device shown in FIG. 1 as viewed in the direction perpendicular to that in the case of FIG. 1.

It should be noted that FIG. 8 shows the cross-sectional structure of the semiconductor device shown in FIG. 1 as viewed in the direction perpendicular to that in the case of FIG. 1. In FIG. 8, the reference numerals 15 and 16 denote interconnections.

Although in this embodiment the opening through which the n-type doped region 5 is exposed is formed in the insulating film 9, it is possible to vary the size of this opening. The film thicknesses, the sizes of the openings or the impurity concentrations may, of course, be appropriately selected in accordance with the characteristics required for each individual semiconductor device.

Figure 9:
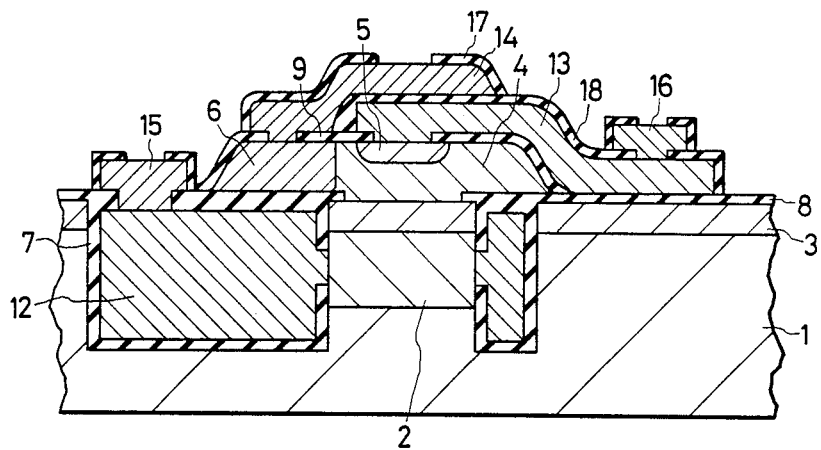
FIGS. 9 to 17 are sectional views respectively showing other embodiments of the present invention.

Embodiment 2:

FIG. 9 is a sectional view of a second embodiment of the present invention, which shows the cross-sectional structure thereof as viewed in the same direction as in the case of FIG. 8.

In the semiconductor device shown in FIG. 8, the polycrystalline silicon layer 13 covers the whole of the insulating film 9, whereas, in the semiconductor device shown in FIG. 9, the polycrystalline silicon layer 13 terminates halfway on the insulating film 9. Accordingly this embodiment has the advantage that the base resistance is lower than that of the device shown in FIG. 8.

Figure 10:
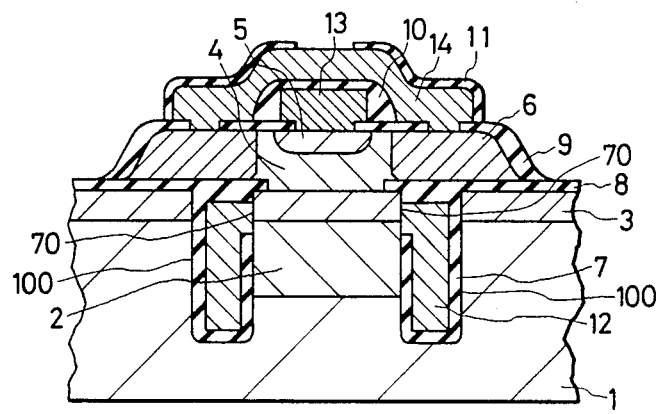

Embodiment 3:

FIG. 10 is a sectional view showing a third embodiment of the present invention. In this embodiment, the opening for connecting together the n-type buried layer 2 and the n-type polycrystalline silicon layer 12 is provided in the upper part of the isolation trench 100. The opening 70 may be provided at any position in that portion of the insulating film 7 which is in contact with the n-type buried layer 2.

Figure 11:
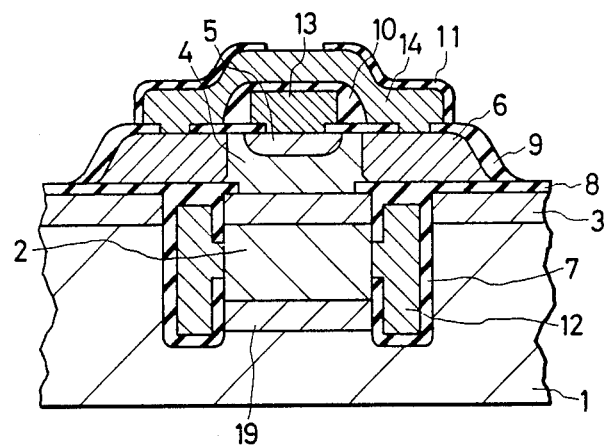

Embodiment 4:

FIG. 11 is a sectional view showing a fourth embodiment of the present invention. In this embodiment, an insulating film 19 is provided between the n-type buried layer 2 and the p-type silicon substrate 1. The presence of the insulating film 19 enables a reduction in the parasitic capacitance between the buried layer 2 and the substrate 1 and hence permits an improvement in the device characteristics.

Figure 12:
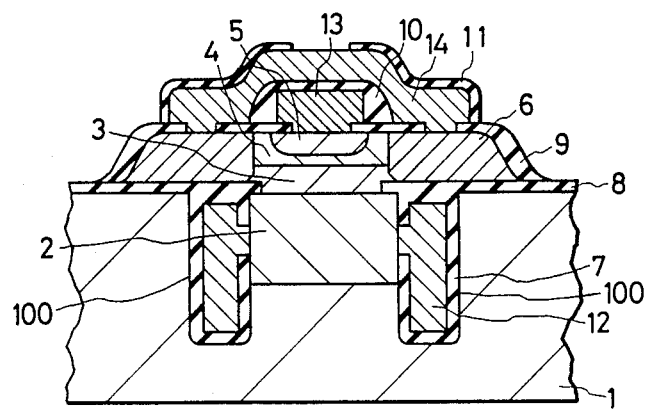

Embodiment 5:

FIG. 12 is a sectional view showing a fifth embodiment of the present invention. In this embodiment, the n-type epitaxial layer 3 is provided above the plane of the insulating film 8. More specifically, the epitaxial layer 3 is grown after the formation of the isolation trench 100 and the insulating film 8. The device structure according to this embodiment has the advantage that it is possible to accurately control the depth of the p-type doped region 4 by employing a method of introducing an impurity from the substrate surface, for example, ion implantation.

In each of the foregoing embodiments, the conductivity types, i.e., n-type and p-type, of all the constitutent elements or portions may be reversed.

Figure 13:
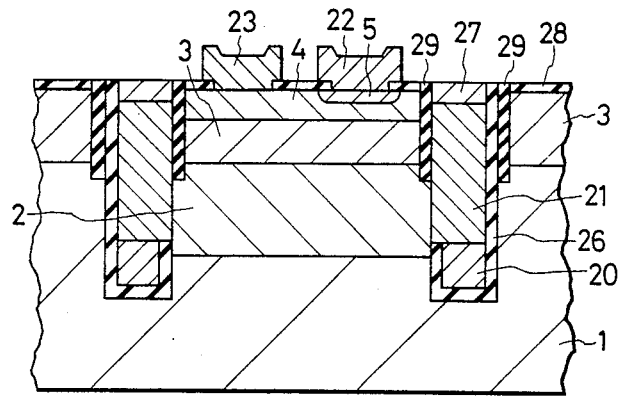

Embodiment 6:

Referring to FIG. 13, which shows another embodiment of the present invention, the reference numeral 1 denotes a p-type silicon substrate, 2 an $n^+$-type buried layer, 3 an n-type epitaxial layer, 4 a p-type region (base), 5 an n+-type region (emitter), 20, 21 low-resistance n+-type polycrystalline silicon, 22 an emitter electrode, 23 a base electrode, 26, 27, 28 silicon dioxide films, and 29 a silicon nitride film.

In comparison with the semiconductor device shown in FIG. 1, this embodiment has the advantage that, since the end portion of the base 4 is covered with the insulating film (silicon nitride 29), the pn junction between the base 4 and the collector is considerably reduced, so that the junction capacitance is exceedingly reduced to increase the operating speed of the transistor. Like the embodiment shown in FIG. 1, this embodiment has the advantage that, since the trench is employed to provide isolation and lead out the collector, the area required to provide the transistor is reduced and it is therefore possible to increase the integration density.

Figure 14:
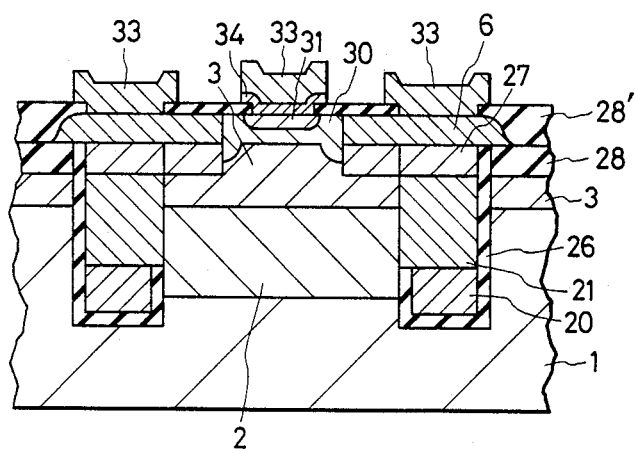

Embodiment 7:

FIG. 14 shows still another embodiment of the present invention.

The feature of this embodiment resides in that an active region of a bipolar transistor is provided in a protruding portion formed by removing an unnecessary portion of the surface of a silicon substrate and a p+-type polycrystalline silicon film 6 for leading out the base is formed on a thick silicon dioxide film 28 formed on the surface of the recess of the silicon substrate. In this embodiment, the p+-type polycrystalline silicon film 6 is connected to the side portion of a p-type base 30. However, the arrangement may be such that the silicon dioxide film 28 is elongated from the surface of the recess in the silicon substrate so as to extend along the side surface of the protruding portion and the p+-type polycrystalline silicon film 6 is connected to either the shoulder portion or upper edge portion of the base 30. The transistor according to this embodiment has the advantages of a small parasitic capacitance and a high operating speed. It should be noted that, in FIG. 14, the reference numeral 31 denotes an n+-type emitter, 33 an aluminum electrode, 28′ a silicon dioxide film and 34 a conductive film.

Figure 15:
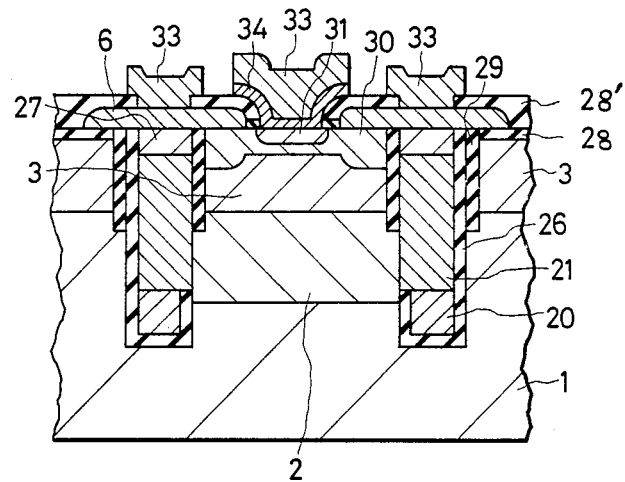

Embodiment 8:

FIG. 15 shows a further embodiment of the present invention which is obtained by modifying the structure shown in FIG. 14. The arrangement of this embodiment may be selected according to the required characteristics.

Figure 16:
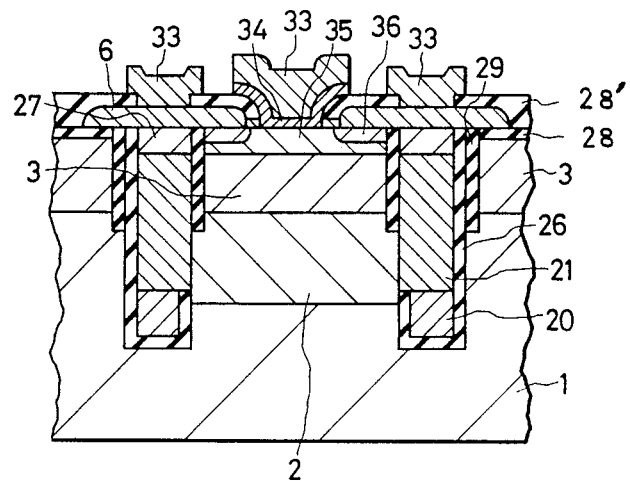

FIG. 16 shows an arrangement wherein the emitter in the device shown in FIG. 15 is formed in a ring shape as shown by the reference numeral 36, and this emitter is led out through the polycrystalline silicon film 6, while the base 35 in led out at the center thereof.

Embodiment 9:

This embodiment is accomplished by forming a base from a first semiconductor layer (bandgap $E_{g1}$) and an emitter from a second semiconductor layer (bandgap $E_{g2}$) and setting the size relation between these bandgaps to $E_{g2} \geq E_{g1}$.

More specifically, the current amplification factor of a bipolar transistor is generally expressed as follows:

$$h_{FE} \alpha \frac{N_E W_E}{N_B W_B} \cdot \exp\left(\frac{E_{g2} - E_{g1}}{kT}\right)$$

wherein $N_E$ is the emitter concentration, $W_E$ is the emitter width, $N_B$ is the base concentration, $W_B$ is the base width, k is the Boltzmann constant, and T is the absolute temperature. In the conventional structure, $E_{g2} = E_{g1}$, and when scaling is made under the constant breakdown voltage, if $W_B \rightarrow 1/\alpha$, then $N_B \rightarrow \alpha^2$, and hence $h_{FE}$ decreases. On the other hand, if the condition of $E_{g2} \geq E_{g1}$ is set as in the case of the present invention, the reduction of $h_{FE}$ as a result of the above-described scaling is cancelled, so that it is possible to obtain a predetermined current amplification factor even if the size of the element is reduced.

By forming the base from the first semiconductor layer (bandgap $E_{g1}$) and the emitter from the second semiconductor layer (bandgap $E_{g2}$), the current amplification factor can be increased exp $$\left(\frac{E_{g2} - E_{g1}}{kT}\right)$$

times. Thus, it is possible to obtain a predetermined current amplification factor even if the size of the element is reduced.

Figure 17:
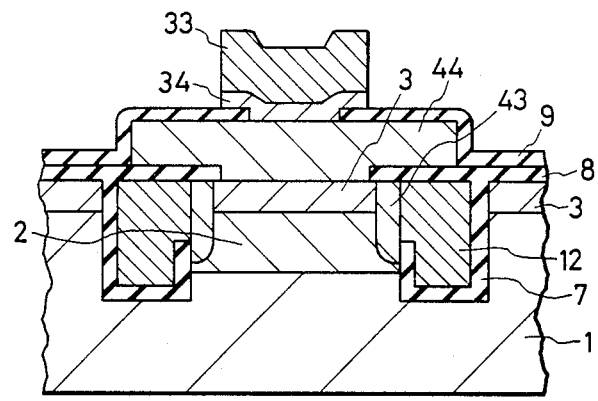

FIG. 17 shows one example of the cross-sectional structure of this embodiment. A pn junction is defined by a p-type base 44 formed from a first semiconductor layer (e.g., a Si-Ge mixed crystal film or an Si film) and an n+-type emitter 34 formed from a second semiconductor layer (e.g., a polycrystalline silicon, microcrystalline silicon or GaAs film). An n-type collector which is formed from an epitaxial silicon layer and an n+-type buried layer 2 are connected to a low-resistance n+-type polycrystalline silicon 12 formed inside a trench through an n+-type low-resistance region 43.

In the present invention, the above-described trench may have any of various kinds of configuration, for example, a U-, Y- or V-shaped cross-sectional configuration.

Although in the foregoing embodiments a single-layer silicon dioxide film is employed as the insulating film 7 formed inside the trench, the insulating film 7 may be arranged such that a silicon dioxide film is first formed on the inner surface of the trench by thermal oxidation and a silicon nitride film is formed thereon by the known CVD. Employment of the stack of silicon dioxide and silicon nitride films is considerably preferable because it is possible to effectively prevent generation of stress in the substrate.

What is claimed is:

1. A semiconductor device comprising:
   a semiconductor substrate having a horizontal surface region;
   a trench having an inner side surface, an upper edge portion and bottom surface, and formed in said semiconductor substrate;
   a plurality of bipolar transistors horizontally spaced from each other and being isolated from each other by said trench;
   said trench having an insulating film formed on its inner surface;
   a low-resistance conductive material filling said trench on the inside of said inner surface of said trench;
   at least one of said bipolar transistors having a vertical stack of collector and emitter regions formed on said semiconductor substrate, a base formed vertically between said collector and emitter regions, and said collector being the lower of said regions having a bottom surface at a higher level than the bottom surface of the trench;

said insulating film having an opening at said trench inner side surface leading to said collector; and said collector being electrically connected to said conductive material in said trench through said opening formed in said insulating film so that said conductive material is a collector, lead-out interconnection layer.

2. A semiconductor device according to claim 1, wherein said collector is a low-resistance buried layer disposed laterally in said semiconductor substrate.

3. A semiconductor device according to claim 1, wherein the collector of said bipolar transistor is formed within a surface region of said semiconductor substrate;

a semiconductor film formed on said semiconductor substrate above said collector; and a base having a side portion and an emitter thereof formed through within the semiconductor film on said semiconductor substrate.

4. A semiconductor device according to claim 3, wherein said emitter has an electrode;

a polycrystalline silicon film extending from the side portion of said base toward the surface of said semiconductor substrate; and said base having an electrode formed on said polycrystalline silicon film.

5. A semiconductor device according to claim 1 including a base and an emitter formed on said semiconductor substrate above said collector; the base having a side portion, the insulating film covering the side portion of said base along the inner surface of said trench.

6. A semiconductor device according to claim 5, wherein said insulating film formed on the inner side surface of said trench is a silicon nitride film.

7. A semiconductor device according to claim 5, including a low-resistance polycrystalline silicon film provided on said semiconductor substrate; and said base having an upper edge portion electrically connected to said low-resistance polycrystalline silicon film provided on said semiconductor substrate.

8. A semiconductor device according to claim 5, further including a polycrystalline silicon film provided on the surface of said semiconductor substrate; and wherein said emitter is ring shaped and formed within said base, and said emitter being electrically connected to said polycrystalline silicon film provided by the surface of said semiconductor substrate.

9. A semiconductor device according to claim 1, including a base and emitter of said bipolar transistor formed above said collector;

an annular recess formed within said semiconductor substrate and defining a central protruding portion of said semiconductor substrate;

an insulating film formed within said annular recess in said semiconductor substrate;

a polycrystalline silicon film stacked on said insulating film formed within said recess; and said bipolar transistor having a base and emitter formed vertically above said collector within said protruding portion of said semiconductor substrate.

10. A semiconductor device according to claim 9, wherein said base has a side portion; and said polycrystalline silicon film is electrically connected to the side portion of said base.

11. A semiconductor device according to claim 9, wherein said base has an upper edge portion; and said polycrystalline silicon film is electrically connected to the upper edge portion of said base.

12. A semiconductor device according to claim 9, wherein said base has a shoulder portion; and said polycrystalline silicon film is electrically connected to the shoulder portion of said base.

13. A semiconductor device comprising:
a semiconductor substrate having s surface region;
a trench having an inner side surface, an upper edge portion and bottom surface, and formed in said semiconductor substrate;
a plurality of vertically stacked bipolar transistors isolated from each other by said trench;
said trench having an insulating film formed on its inner surface;
a low-resistance conductive material filling said trench on the inside of said inner surface of said trench;
at least one of said bipolar transistors having a collector, said collector having a bottom surface at a higher level than the bottom surface of the trench;
said insulating film having an opening at said trench inner side surface leading to said collector; and
said collector being electrically connected to said conductive material in said trench through said opening formed in said insulating film, wherein said bipolar transistor has a base and emitter respectively formed from material having different band gap energies.

14. A semiconductor device comprising:
a semiconductor substrate having a surface region;
a trench having an inner side surface, an upper edge portion and bottom surface, and formed in said semiconductor substrate;
a plurality of vertically stacked bipolar transistors isolated from each other by said trench;
said trench having an insulating film formed on its inner surface;
a low-resistance conductive material filling said trench on the inside of said inner surface of said trench;
at least one of said bipolar transistors having a collector, said collector having a bottom surface at a higher level than the bottom surface of the trench;
said insulating film having an opening at said trench inner side surface leading to said collector; and
said collector being electrically connected to said conductive material in said trench through said opening formed in said insulating film, wherein said bipolar transistor has a base and emitter formed from materials wherein the band gap energy of said emitter material is equal to or larger than the band gap energy of said base material.

15. A semiconductor device according to claim 14, wherein said base material is a film selected from the group consisting of a Si-Ge mixed crystalline film and a Si film.

16. A semiconductor device according to claim 14, wherein said emitter material is a film selected from the group consisting of polycrystalline silicon film, microyrstalline silicon film and a GaAs film.

17. A semiconductor device according to claim 1, wherein said low resistance conductive material comprises a polycrystalline silicon.

18. A device comprising;
a semiconductor substrate having a surface region;
an n-type buried layer having a bottom and formed in a portion of said substrate;
an epitaxial layer grown upon said surface region;

a semiconductor film formed on said semiconductor substrate;

a plurality of active devices horizontally spaced from each other on said substrate;

each of said active devices including a vertical stack of collector and emitter regions formed on said substrate, and a base formed between said collector and emitter regions;

said base having side, upper edge and shoulder portions;

a trench formed in said substrate through said epitaxial layer having an inner surface and a bottom and being formed directly against the lower of said regions and separating said devices from each other;

an insulating film formed on the inner surface of said trench;

said insulating film, covering the bottom of said trench, is lower than the bottom of said buried layer;

an opening formed in a side of said insulating film that is against the lower of said regions; and a homogeneous low-resistance conductive material making electrical contact directly with the lower of said regions through said opening and filling said trench.

19. A device according to claim 18, wherein said active devices are a plurality of bipolar transistors isolated from each other by said trench.

20. A device according to claim 18, wherein one of said regions is formed within the surface region of the semiconductor substrate; and the base and the other of said regions are formed within the semiconductor film formed on said semiconductor substrate.

21. A device according to claim 18, wherein said insulating film formed on the inner surface of said trench is a silicon nitride film.

22. A device according to claim 18, wherein one of said regions is a ring shaped region formed within said base.

23. A device according to claim 19, wherein at least the base and one of said regions of said bipolar transistor are formed within a protruding portion of said epitaxial layer.

24. A device according to claim 23, an insulating film formed on said base;

a conductive film formed on said insulating film and being electrically connected to said base.

25. A device according to claim 24, wherein said semiconductor film is connected to the side portion of said base.

26. A device according to claim 18, wherein the base and one of said regions form the top of the bipolar transistor and are formed from materials having different band gap energies.

27. A device according to claim 18, wherein the band gap energy of one of said regions, forming the top of the bipolar transistor, is equal to or larger than the band gap energy of said base.

28. A device according to claim 26, wherein said base is defined by a film selected from the group consisting of a Si-Ge mixed crystal film and Si film.

29. A device according to claim 18, wherein said conductive material comprises polycrystalline silicon.

30. A device according to claim 27, wherein said base is defined by a film selected from the group consisting of a Si-Ge mixed crystal film and Si film.

* * * * *